United States Patent [19]

Neurgaonkar et al.

[11] Patent Number: 5,595,677
[45] Date of Patent: Jan. 21, 1997

[54] NB-DOPED PLZT PIEZOELECTRIC CERAMICS

[75] Inventors: Ratnakar R. Neurgaonkar, Thousand Oaks; John R. Oliver, Newbury Park; Jeffrey G. Nelson, Thousand Oaks, all of Calif.

[73] Assignee: Rockwell International Corporation, Seal Beach, Calif.

[21] Appl. No.: 452,923

[22] Filed: May 30, 1995

[51] Int. Cl.$^6$ ................................................. C04B 35/491
[52] U.S. Cl. .................... 252/62.9; 501/134; 501/152
[58] Field of Search ..................... 252/62.9 PZ; 501/134, 501/152

[56] References Cited

U.S. PATENT DOCUMENTS 5,364,710  11/1994  Hikita .......................................... 429/9

OTHER PUBLICATIONS

Neurgaonkar et al., "Properties of Dense PLZT Piezoelectric", J. Intell. Mat'l. Sys. and Struct., vol. 4, pp. 272–275, Apr. 1993.
Tanaka et al, "Photochromic Effect in Impurity–doped PLZT Ceramic", Electron. Lett., vol. 10, No. 11, pp. 350–351, Aug. 22, 1974.
Chem. Abstract 121:48024:Murty et al, *Hysteresis Behavior and Piezoelectric Properties of * Nb doped PLZT ceramics*, ISAF '92 Proc. IEEE Int. Symp. Appl. Ferroelect., 8th (1992), 500–3.
Chem. Abstract 115:195780: Murty et al, "Effect of Nb (5+) substitution on the piezoelectric properties of PLZT ceramics. Ferroelectrics (1991), 119(1–4), " pp. 119–122.
Murty et al, *Hysteresis Behavior and Piezoelectric Properties of * Nb doped PLZT ceramics*, ISAF '92 Proc. IEEE Int. Symp. Appl. Ferroelect., 8th (1992), 500–3.

Murty et al, "Effect of Nb (5+) substitution on the piezoelectric properties of PLZT ceramics. Ferroelectrics (1991), 119(1–4), "pp. 119–122.
Neurgaonkar et al., "Properties of Dense PLZT Piezoelectrics," *Journal of Intelligent Material Systems and Structures*, vol. 4, pp. 272–275 (Apr. 1993).

Primary Examiner—Melissa Bonner
Attorney, Agent, or Firm—John C. McFarren

[57] ABSTRACT

PLZT piezoelectric ceramics having the general formula $(Pb_{1-x}La_x)(Zr_y Ti_{1-y})_{1-(x/4)}O_3$ are fabricated in a hot forging process using PbO, $TiO_2$, $ZrO_2$, and $La_2O_3$ powders as starting materials with $Nb_2O_5$ added to provide niobium (Nb) as a dopant. The $ZrO_2$ and $TiO_2$ powders are mixed at a molar ratio of $y/(1-y)$, calcined at approximately 1300°–1500° C., ball milled in acetone, and evaporated to a dry powder. The mixture of $ZrO_2$ and $TiO_2$ is then combined with the PbO, $La_2O_3$, and $Nb_2O_5$ powders, and the new mixture is ball milled in acetone, evaporated to a dry powder, calcined at approximately 700°–850° C., and sifted to obtain a particle size of approximately 0.3–2.0 μm. The final PLZT powder is formed into the desired shape by cold pressing followed by sintering at approximately 1000°–1150° C. in oxygen. The PLZT ceramic material is further densifted to about 98.5% of the material's theoretical maximum density by heating to approximately 1175°–1275° C. at 800–1200 psi uniaxial pressure. The resulting high performance Nb-doped PLZT piezoelectric ceramic exhibits an average grain size of about 3 μm, a well-defined polarization hysteresis loop, reduced strain hysteresis with the application of a unipolar electric field, a breakdown strength greater than 25 kV/cm, a linear piezoelectric coefficient ($d_{33}$) greater than 750, maximum strain greater than 0.15%, and a fatigue life of at least $10^{10}$ cycles.

10 Claims, 1 Drawing Sheet

NB-DOPED PLZT PIEZOELECTRIC CERAMICS

TECHNICAL FIELD

The present invention relates to piezoelectric materials and, in particular, to high performance, Nb-doped PLZT piezoelectric ceramics.

BACKGROUND OF THE INVENTION

Performance of piezoelectric actuators and sensors is affected by the microstructural properties of the piezoelectric materials. Commercially available piezoelectric materials, including PZT, PLZT, and PMN-PT, typically exhibit good piezoelectric response but poor fatigue life. Attempts have been made in the past to improve the microstructure of piezoelectric materials using fine-grained precursors with conventional sintering techniques. Although such attempts at microstructural improvement have enhanced some piezoelectric performance characteristics, fatigue life remains low because conventionally sintered ceramics typically have densities of only 90–95% of their theoretical values. Thus, there is a need for new methods of fabricating piezoelectric materials to achieve improved grain orientation, greater density, and extended fatigue life.

SUMMARY OF THE INVENTION

The present invention comprises a family of Nb-doped PLZT piezoelectric ceramics. The PLZT ceramics are fabricated using PbO, $TiO_2$, $ZrO_2$, and $La_2O_3$ powders as starting materials in a hot forging technique to produce a PLZT piezoelectric ceramic having the general formula $(Pb_{1-x}La_x)(Zr_y Ti_{1-y})_{1-(x/4)} O_3$. In the steps of the fabrication method, $ZrO_2$ and $TiO_2$ powders are mixed at a molar ratio of y/(1−y), calcined at approximately 1300°–1500° C., and ball milled in acetone. After milling, the acetone is evaporated to produce a dry powder. The mixture of $ZrO_2$ and $TiO_2$ is then combined with appropriate amounts of the PbO and $La_2O_3$ powders plus $Nb_2O_5$ added to provide 0.5–1.5% $Nb^{5+}$ (mole %) as a dopant, and the new mixture is ball milled in acetone, evaporated to a dry powder, calcined at approximately 700°–850° C., and sifted to obtain a particle size of approximately 0.3–2.0 μm. The final PLZT powder may be formed into the desired shape by cold pressing (typically at 15,000–25,000 pounds, for example) followed by sintering at approximately 1000°–1150° C. in oxygen. The PLZT ceramic material may be further densified by heating to approximately 1175°–1275° C. at 800–1200 psi to achieve a density of at least 97% (preferably at least 98.5%) of the material's theoretical maximum density.

The PLZT ceramic materials of the present invention display a strong dielectric permittivity maximum at approximately 155°–165° C., above and below which the permittivity drops rapidly. The ceramic becomes a polar dielectric below about 112°–125° C. with a stable net spontaneous polarization, $P_r$, and a well-defined polarization hysteresis loop (P versus bipolar electric field). A distinguishing feature of these PLZT ceramics, compared with other piezoelectric ceramics, is reduced strain hysteresis with the application of a unipolar electric field. The breakdown strength of the PLZT ceramic material is greater than 25 kV/cm (typically 25–30 kV/cm), well above the typical operating electric field strengths that are normally used for piezoelectric actuation. Furthermore, the linear piezoelectric coefficient ($d_{33}$), the maximum strain (%), and the fatigue life (cycles) of the Nb-doped PLZT ceramics of the present invention are significant advances over known piezoelectric materials.

A principal object of the invention is fabrication of high performance piezoelectric materials that have a long fatigue life. A feature of the invention is a Nb-doped PLZT piezoelectric ceramic having high density and fine grain microstructure. An advantage of the invention is PLZT piezoelectric ceramics that exhibit a fatigue life on the order of $10^{10}$ cycles and above.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

Figure 1:
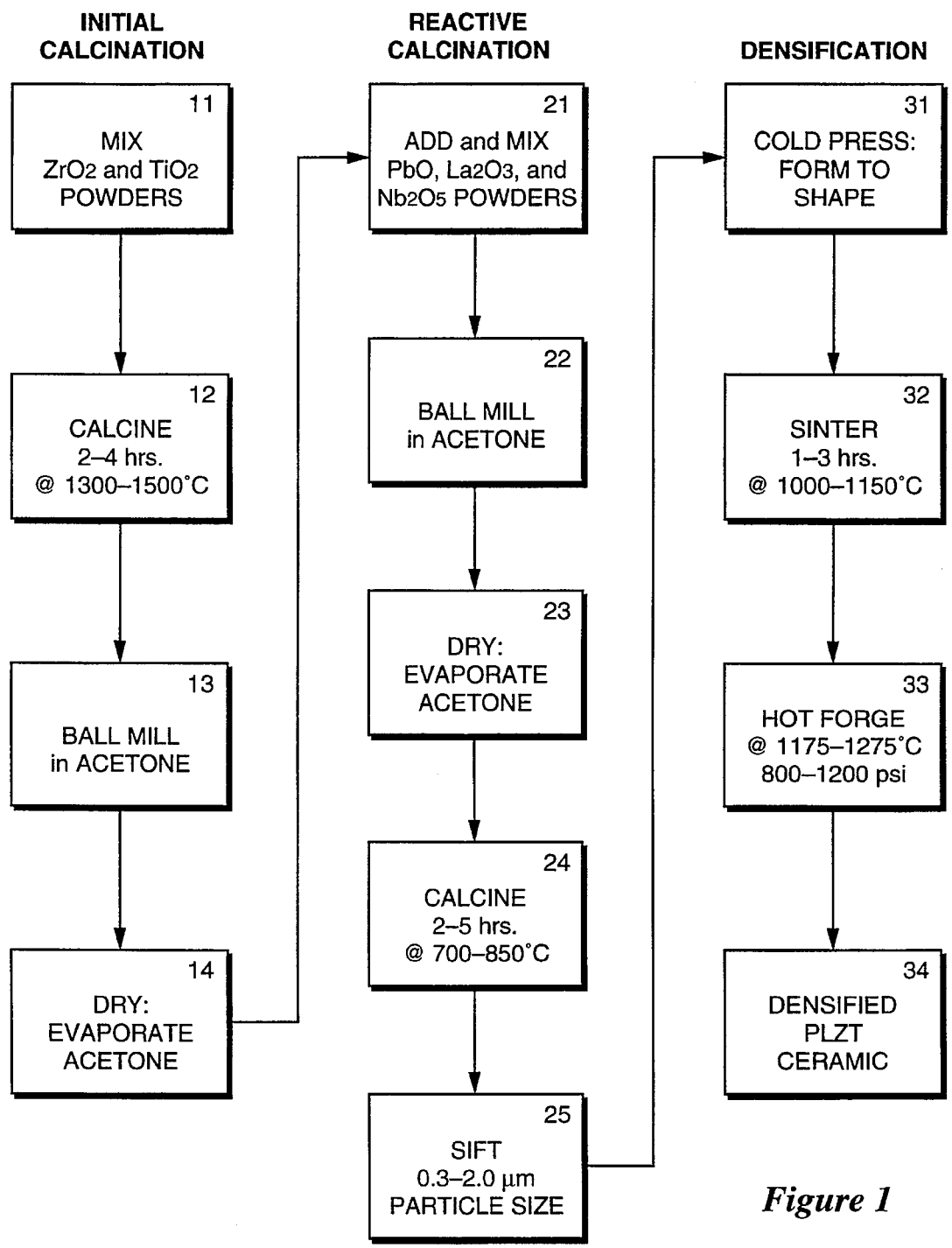
FIG. 1 is a process flow chart for the method of fabricating Nb-doped PLZT piezoelectric ceramics of the present invention.

The present invention comprises a family of Nb-doped PLZT piezoelectric ceramics. The object is to provide high performance piezoelectric materials having improved microstructure and high density for a long fatigue life. PLZT piezoelectric ceramics of the present invention have the general formula $(Pb_{1-x}La_x)(Zr_y Ti_{1-y})_{1-(x/4)} O_3$ and are fabricated by a hot forging technique using PbO, $TiO_2$, $ZrO_2$, and $La_2O_3$ powders as starting materials with $Nb_2O_5$ added to provide 0.5–1.5% $Nb^{5+}$ (mole %) as a dopant.

The formula of a preferred PLZT composition (PLZT (7/60/40), where x=0.07 and y=0.60) is $Pb_{0.93} La_{0.07} (Zr_{0.60} Ti_{0.40})_{0.9825} O_3$. To fabricate this PLZT ceramic, the precursor materials may be mixed by weight, as in the following example: PbO: 163 gm.; $La_2O_3$:9 gm.; $ZrO_2$: 56 gm.; $TiO_2$: 24 gm; and $Nb_2O_5$: 1 gm.

The first stage of producing PLZT (7/60/40) involves initial reactive calcination of $ZrO_2$ and $TiO_2$, as shown in the first column of FIG. 1. In the method of fabrication, as indicated at step 11 of FIG. 1, $ZrO_2$ and $TiO_2$ powders are mixed at a molar ratio of y/(1−y), which is a ratio of 60/40 (or approximately 70/30 weight %) for the example of PLZT (7/60/40). The mixture may be mixed in a Nalgene bottle for about 5 minutes and then placed in a platinum crucible. The mixture of $ZrO_2$ and $TiO_2$ powders is then calcined at approximately 1300°–1500° C. for about 2–4 hours, as shown at step 12. After calcination, the powder mixture is ball milled in acetone for about 40–50 hours, as shown at step 13. After milling, the acetone is as evaporated to produce a dry powder at step 14.

The next stage of the process involves reactive calcination of the PLZT powder mixture, as shown in the second (middle) column of FIG. 1. The calcined and milled mixture of $ZrO_2$ and $TiO_2$ from the first stage of the process is combined with appropriate amounts of the PbO, $La_2O_3$, and $Nb_2O_5$ powders (such as indicated in the example above), as shown at step 21. The PLZT mixture is ball milled in acetone for about 40–50 hours at step 22 and evaporated to as a dry powder at step 23. The milled PLZT powder mixture is then calcined at approximately 700°–850° C. for about 2–5 hours at step 24 and sifted (e.g., through a screen) at step 25 to as obtain a particle size of approximately 0.3–2.0 μm.

The final stage of the process is densification of the PLZT powder mixture, as shown in the third (right-hand) column of FIG. 1. The milled and calcined PLZT powder can be formed into a desired shape, such as a 1.5 inch diameter disk comprising about 150 grams of powder, for example, by cold pressing at about 15,000–25,000 pounds, as indicated at step 31. The formed shape is then sintered (for about 1–3 hours at approximately 1000°–1150° C. in oxygen, for example) at step 32 to produce a PLZT ceramic. The PLZT ceramic material can be further densified by hot forging, as shown in step 33, by heating to approximately 1175°–1275° C. at 800–1200 psi uniaxial pressure for about 1–3 hours to produce a densified Nb-doped PLZT ceramic, as indicated at step 34, having a final average grain size of about 3 gm and a density of at least 97% (preferably at least 98.5%) of the material's theoretical maximum density. Example properties of Nb-doped PLZT (7/60/40) produced by the foregoing method are listed in Table 1 below.

TABLE 1

| Property | Range |
|---|---|
| Ferroelectric Transition, $T_c$(°C.) | 112–125° C. |
| Dielectric Constant, $\epsilon$ | 4000–5500 |
| Dielectric Losses, % | <7% |
| Spontaneous Polarization, $P_r$ ($\mu C/cm^2$) | 30–33 |
| Linear Piezoelectric Coefficient, $d_{33}$ (pC/N) | 750–1060 |
| Maximum Strain, % | 0.16–0.22% |
| Fatigue Life, cycles | >$10^{10}$ |

The PLZT (7/60/40) ceramic material fabricated using the foregoing method displays a strong dielectric-permittivity maximum at approximately 155°–160° C., above and below which the permittivity drops rapidly. PLZT (7/60/40) becomes a polar dielectric below about 112°–125° C., exhibiting a stable net spontaneous polarization, $P_r$, and a well-defined polarization hysteresis loop (P versus bipolar electric field). As compared with conventional piezoelectric ceramics, Nb-doped PLZT ceramics of the present invention have reduced strain hysteresis with the application of a unipolar electric field. In addition, the breakdown strength of these PLZT ceramic materials is greater than about 25 kV/cm (generally 25–30 kV/cm), well above the typical operating electric field strengths that are normally used for piezoelectric actuation. Furthermore, the linear piezoelectric coefficient ($d_{33}$), the maximum strain (%), and the fatigue life (cycles) of the Nb-doped PLZT ceramic materials of the present invention are significant advances over known piezoelectric materials.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

We claim:

1. A piezoelectric material, comprising:

a PLZT material having the general formula $(Pb_{0.93}La_{0.07})(Zr_{0.6}Ti_{0.4})_{0.9825}O_3$;

said PLZT material doped with 0.5–1.5 mole % $Nb^{5+}$; and said PLZT material having an average grain size of about 3 µm and a maximum piezoelectric strain in the range of 0.16–0.22%.

2. The piezoelectric material of claim 1, wherein said Nb-doped PLZT material has a fatigue life of at least $10^{10}$ cycles.

3. The piezoelectric material of claim 2, wherein said Nb-doped PLZT material has a density of at least 98.5% of the material's theoretrical maximum density.

4. Thepiezoelectric material of claim 1, wherein said Nb-doped PLZT material has a breakdown strength of at least 25 kV/cm.

5. The piezoelectric material of claim 1, wherein said PLZT material has a linear piezoelectric coefficient ($d_{33}$) in the range of 750–1060.

6. A high density piezoelectric material, comprising:

a PLZT material having the general formula $(Pb_{0.93}La_{0.07})(Zr_{0.6}Ti_{0.4})_{0.9825}O_3$;

said PLZT material doped with 0.5–1.5 mole % $Nb^{5+}$;

said PLZT material having an average grain size of about 3 µm, a density of at least 98.5% of the material's theoretical maximum density, and a fatigue life of at least $10^{10}$ cycles; and said PLZT material having a linear piezoelectric coeffcient ($d_{33}$) in the range of 750–1060, a maximum piezoelectric strain in the range of 0.16–0.22%, and a breakdown strength of at least 25 kV/cm.

7. A piezoelectric actuator material, comprising:

a PLZT material having the general formula $(Pb_{0.93}La_{0.07})(Zr_{0.06}Ti_{0.4})_{0.9825}O_3$;

said PLZT material doped with 0.5–1.5 mole % $Nb^{5+}$; and said PLZT material having an average grain size of about 3 µm, a density of at least 98.5% of the material's theoretical maximum density, and a maximum piezoelectric strain in the range of 0.16–0.22%.

8. The piezoelectic actuator material of claim 7, wherein said Nb-doped PLZT material has a fatigue life of at least $10^{10}$ cycles.

9. The piezoelectric actuator material of claim 7, wherein said Nb-doped PLZT material has a linear piezoelectric coefficient ($d_{33}$) in the range of 750–1060.

10. The piezoelectric actuator material of claim 7, wherein said Nb-doped PLZT material has a breakdown strength of at least 25 kV/cm.

* * * * *